United States Patent
Priel et al.

(10) Patent No.: US 9,141,178 B2
(45) Date of Patent: Sep. 22, 2015

(54) DEVICE AND METHOD FOR SELECTIVE REDUCED POWER MODE IN VOLATILE MEMORY UNITS

(75) Inventors: Michael Priel, Hertzelia (IL); Anton Rozen, Gedera (IL); Leonid Smolyansky, Zichron Yakov (IL)

(73) Assignee: Freescale Semiconductor, Inc., Austin, TX (US)

(*) Notice: Subject to any disclaimer, the term of this patent is extended or adjusted under 35 U.S.C. 154(b) by 261 days.

(21) Appl. No.: 13/634,999

(22) PCT Filed: Jun. 11, 2010

(86) PCT No.: PCT/IB2010/052599
§ 371 (c)(1),
(2), (4) Date: Sep. 14, 2012

(87) PCT Pub. No.: WO2011/154776
PCT Pub. Date: Dec. 15, 2011

(65) Prior Publication Data
US 2013/0132753 A1    May 23, 2013

(51) Int. Cl.
| | |
|---|---|
| *G06F 1/00* | (2006.01) |
| *G06F 1/26* | (2006.01) |
| *G06F 1/32* | (2006.01) |
| *G06F 11/00* | (2006.01) |
| *G01R 31/28* | (2006.01) |
| *G01R 31/3185* | (2006.01) |
| *G06F 11/14* | (2006.01) |

(52) U.S. Cl.
CPC ...... *G06F 1/3275* (2013.01); *G01R 31/318536* (2013.01); *G01R 31/318558* (2013.01); *G06F 1/3203* (2013.01); *G06F 1/3287* (2013.01); *G06F 11/1402* (2013.01); *Y02B 60/1228* (2013.01); *Y02B 60/1282* (2013.01)

(58) Field of Classification Search
None
See application file for complete search history.

(56) References Cited

U.S. PATENT DOCUMENTS

| | | | |
|---|---|---|---|
| 6,058,063 A | 5/2000 | Jang | |
| 6,240,048 B1 | 5/2001 | Matsubara | |
| 6,336,161 B1 | 1/2002 | Watts | |
| 7,164,301 B2 | 1/2007 | Chun | |
| 7,610,571 B2 | 10/2009 | Chen | |
| 7,616,041 B2 | 11/2009 | Frederick, Jr. et al. | |
| 7,626,434 B2 | 12/2009 | Aksamit | |

(Continued)

FOREIGN PATENT DOCUMENTS

| | | |
|---|---|---|
| EP | 0636983 | 2/1995 |
| WO | 2008129362 | 10/2008 |

OTHER PUBLICATIONS

International Search Report and Written Opinion correlating to PCT/IB2010/052599 dated Feb. 28, 2011.

(Continued)

*Primary Examiner* — Ji H Bae

(57) ABSTRACT

An information processing device comprises a first memory, a second memory, data transfer circuitry, power gating circuitry, and a controller. The first memory comprises at least two volatile memory units. The controller receives or generates a request for setting the information processing device into a reduced power mode; in response to the request, it selects specific memory units among the memory units; controls the data transfer circuitry to transfer data from the selected memory units to the second memory; and controls the power gating circuitry to power down the selected memory units.

19 Claims, 4 Drawing Sheets

(56) References Cited

U.S. PATENT DOCUMENTS

| | | | |
|---|---|---|---|
| 7,895,466 B2* | 2/2011 | Barrow | 714/4.11 |
| 2004/0230851 A1 | 11/2004 | Chao et al. | |
| 2005/0240848 A1* | 10/2005 | Cote et al. | 714/726 |
| 2006/0059380 A1 | 3/2006 | Kimura | |
| 2006/0174144 A1* | 8/2006 | Kim et al. | 713/300 |
| 2006/0255849 A1 | 11/2006 | Chun | |
| 2007/0234077 A1 | 10/2007 | Rothman et al. | |
| 2008/0201592 A1 | 8/2008 | Lawrence et al. | |
| 2008/0235528 A1 | 9/2008 | Kim et al. | |
| 2008/0259699 A1 | 10/2008 | Van Berkel | |
| 2009/0085552 A1 | 4/2009 | Franza et al. | |
| 2009/0207423 A1 | 8/2009 | Shimizu et al. | |
| 2010/0174956 A1* | 7/2010 | Kawasaki et al. | 714/726 |
| 2011/0216578 A1* | 9/2011 | Penzes | 365/154 |

OTHER PUBLICATIONS

Final Office Action mailed Mar. 31, 2015 for U.S. Appl. No. 13/634,755, 16 pages.

Non-Final Office Action mailed Nov. 4, 2014 for U.S. Appl. No. 13/634,755, 16 pages.

Tanenbaum, Andrew, "Structured Computer Organization," 1984; Prentice-Hall; Second Edition, pp. 10-12.

Notice of Allowance mailed Jun. 12, 2015 for U.S. Appl. No. 13/634,755, 5 pages.

* cited by examiner

DEVICE AND METHOD FOR SELECTIVE REDUCED POWER MODE IN VOLATILE MEMORY UNITS

FIELD OF THE INVENTION

This invention relates to an information processing device and a method.

BACKGROUND OF THE INVENTION

Semiconductor based logic devices often have a non-negligible power consumption due to leakage currents. Leakage currents occur notably in the interval between two subsequent state transitions. They typically persist even when the device is not performing any logical operations. Quite generally, leakage currents can only be reduced at the cost of operating speed. They are therefore a cause of concern, in particular with modern devices operating at high frequencies.

A well-known solution to saving energy is to set the device, or components thereof, in a so-called sleep state or reduced power mode, when there is a certain likelihood that the device or the components will be idle for a certain period. For example, it is known to switch off a volatile memory when it is expected that the memory will not be required in a near future. The data contained in the volatile memory may be transferred to a low-power memory, e.g. a permanent memory such as a hard disk, before the volatile memory is powered off. Thus the state of the volatile memory is conserved. When a return to normal operation is desired, the data is transferred back from the low-power memory to the volatile memory. A reduced power mode is sometimes referred to alternatively as an idle mode, stand-by mode, suspend mode, sleep mode, deep sleep mode, or hibernate mode.

State retention power gating (SRPG) is a technique that is widely employed in mobile integrated circuits (ICs). It allows a leakage reduction with fast recovery time. However, a problem with SRPG usually is an area overhead resulting from special flip-flops and additional power grids. The typical area penalty may about 10%. Furthermore, transferring large amounts of data from all flip-flops of a CPU typically requires a large dedicated memory and fast buses to this memory.

U.S. Pat. No. 7,164,301 by Ch. Chun proposes a particular technique for saving energy in a memory composed of flip-flops, each flip-flop comprising a latch for holding one bit of information. Each of the latches has a reset state, which is predefined by hardware as either logic TRUE (also termed HIGH or ONE or 1) or logic FALSE (also termed LOW or ZERO or 0). The memory is set into a reduced power mode by switching off those latches which are in their respective reset states. The memory is returned to normal mode by switching on the latches which were switched off and by resetting them into their respective reset states. Thus no information is lost. The method is implemented by providing each individual flip-flop with additional logical circuitry and a power switch (power gate).

U.S. patent application publication US 2008/0201592 describes a data processing apparatus comprising processing circuitry comprising a plurality of state retention cells in the form of scan chains. In response to a hibernate signal, a state of the processing circuitry is encrypted and saved to a non-volatile memory.

U.S. Pat. No. 7,626,434 discloses a low leakage state retention circuit.

U.S. Pat. No. 6,336,161 describes a computer configuration system with state restoration from non-volatile semiconductor memory.

SUMMARY OF THE INVENTION

The present invention provides an information processing device and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
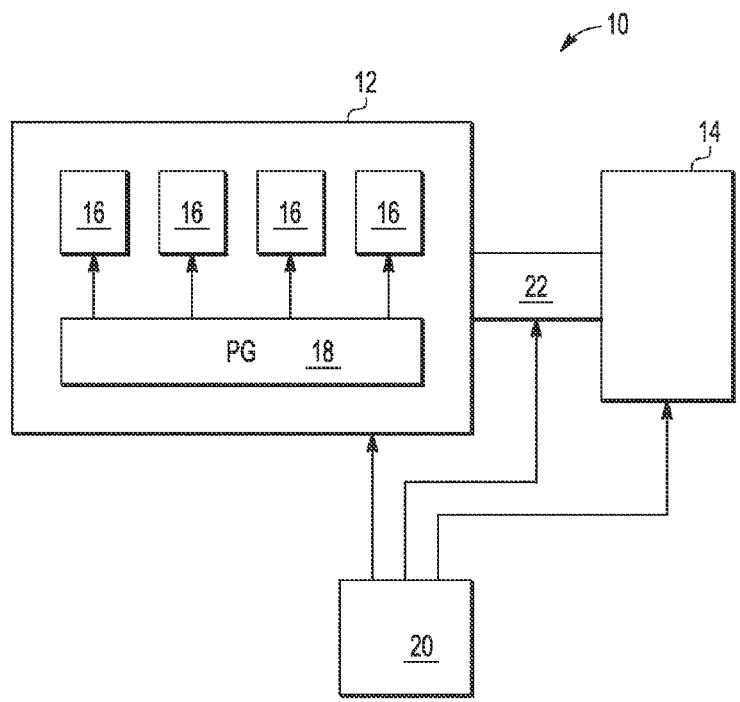
FIG. 1 schematically shows an example of an embodiment of an information processing device.

FIG. 1 schematically illustrates an example of an information processing device 10, comprising a first memory 12, a second memory 14, data transfer circuitry 22, power gating circuitry 18, and a controller 20. The first memory 12 comprises at least two volatile memory units 16. In the example shown, the first memory 12 comprises four volatile memory units. The second memory 14 may have a lower power consumption per byte than the first memory. The second memory 14 may in particular be a volatile cache, a non-volatile cache, or any other suitable memory, for example a flash memory or a hard disk, or a combination of different memories. The controller may be e.g. a processor, in particular a microprocessor, or any other suitable control device.

The controller 20 is configured to enable it to operate as follows. The controller 20 may receive or generate a request for setting the information processing device 10 into a reduced power mode. In response to this request (reduced power mode request), the controller 20 selects specific memory units 24 (see FIGS. 3 and 4) among the memory units 16. The controller 20 then controls the data transfer circuitry 22 to transfer data from the selected memory units 24 to the second memory 14. It further controls the power gating circuitry 18 to power down the selected memory units 24 when the data transfer is complete. The controller 20 may notably be configured to power down only the selected ones 24 of the memory units 16, while leaving non-selected memory units 26 on power. The controller 20 may in particular be software-configured for selecting specific memory units 24 among the memory units 16. For instance, the procedure by which the controller 20 selects specific memory units may be defined by an operating system stored on the information processing device 10.

The specific memory units 24 are thus selected at runtime rather than being predefined by e.g. hardware or by an operating system. In other words, the memory units 24 are selected dynamically. Thus power can be saved notably in situations in which only some of the memory units 24 are expected to be needed in an interval following the request, or in which an expected duration of an idle state is too short as to justify switching off the entire first memory. The information processing device 10 can thus adapt its response to the reduced power mode request to both the request itself and to other conditions, which may vary over time. A good trade-off between the times for entering and exiting the reduced power mode (enter/exit times) on the one hand and leakage savings can thus be achieved. Furthermore, the proposed SRPG method can be implemented without special flip-flops and BE stages and may therefore have no or only a small area impact on a chip.

In practice it occurs that a predefined list of e.g. flip-flops to be powered down when entering a sleep mode is faulty. The proposed approach may solve this problem, as it allows to redefine such a list during runtime.

Figures 2, 3:
FIG. 2 schematically shows an example of an embodiment of a set of volatile memory units.
FIG. 3 schematically shows the volatile memory units shown in FIG. 2.

FIGS. 2 and 3 schematically illustrate the four volatile memory units 16 shown in FIG. 1 at two different points in time, namely, after a first reduced power mode request and a after a later second reduced power mode request. In response to each reduced power mode request, the controller 20 selects specific memory units 24 among the memory units 16. In the example, the controller 20 selects the second and third memory unit 16 (from the left) in response to the first reduced power mode request and only the first memory unit 16 (from the left) in response to the second reduced power mode request. The remaining units 26 are not selected.

The controller 20 may for example be configured to select the specific memory units 24 on the basis of an identifier identifying the reduced power mode. The identifier may be indicative of a power saving level, e.g. of a "sleep" of a "deep sleep" level. Alternatively or additionally, the controller 20 may be configured for selecting the specific memory units 24 on the basis of a current state of the information processing device 10, for example on the basis of the current states of the memory units 16 themselves. Alternatively or additionally, the controller 20 may be configured for selecting the specific memory units 24 on the basis of a desired state of the information processing device 10 to be assumed on exiting the selected reduced power mode. Alternatively or additionally, the controller 20 may be configured for selecting the specific memory units 24 on the basis of an expected duration of the reduced power mode. The duration may be estimated for example on the basis of operating statistics accumulated during previous operation of the information processing device 10.

The controller 20 may notably be configured for selecting the specific memory units 24 by means of a look-up table. For instance, the look-up table may assign to each of a plurality of different power mode identifiers a corresponding set of memory units 16 which are to be powered down. As another example, the look-up table may assign to each of a plurality of different expected idle time durations a corresponding set of memory units 16.

Figure 4:
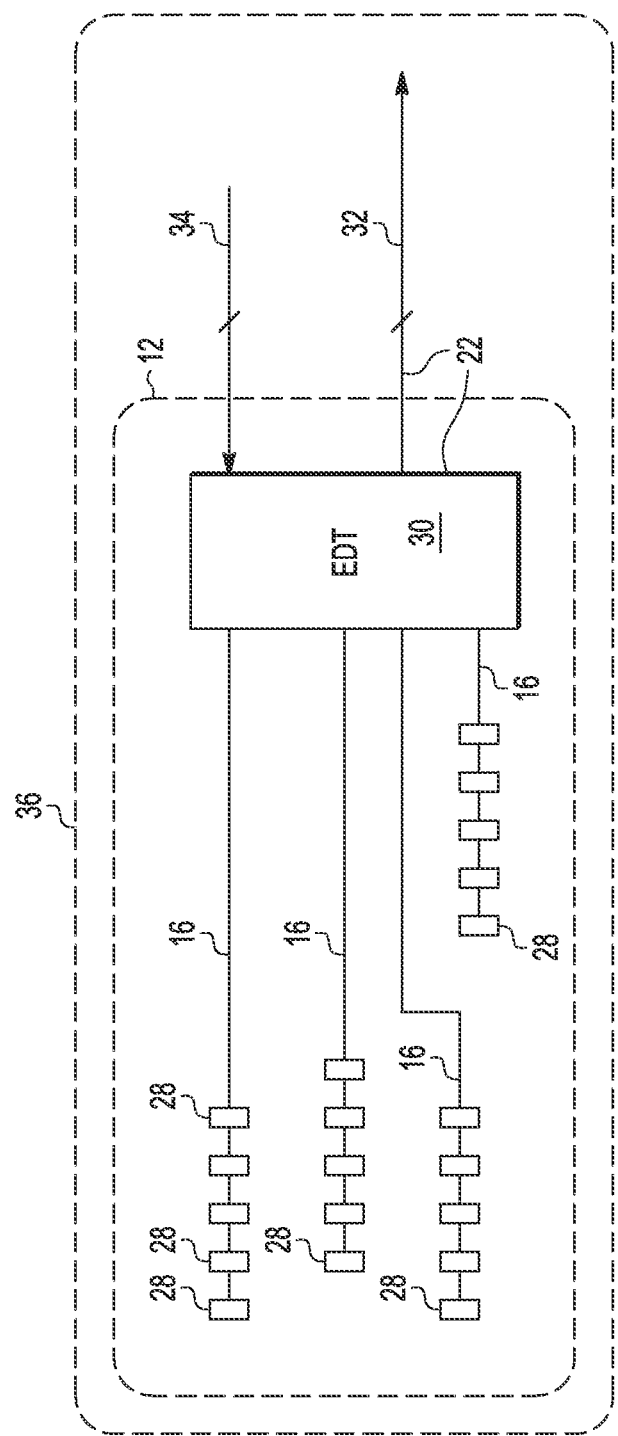
FIG. 4 schematically shows an example of an embodiment of a system on a chip.

Referring now to FIG. 4, there is illustrated an example of a system on a chip 36 comprising a first memory 12 and data transfer circuitry 22 as described above with reference to FIG. 1. At least one of the memory units 16 comprises memory elements 28 arranged in a scan chain. In the example, every memory unit 16 comprises memory elements 28 arranged in a scan chain. The memory elements 28 may for example be latches, flip-flops or registers. The data transfer circuitry 22 comprises e.g. a multiplexer 30. In the example, the multiplexer is controlled by a control signal 34 so as to retrieve data from memory units 16 specified by the control signal 34 and to generate a multiplexed data signal 32 which is transmitted to the second memory 14 (see FIG. 1) via a bus. The multiplexer 30 and the scan chains 16 may for example be of a design conventionally employed for Embedded Deterministic Testing (EDT). Of course, other designs can be used for transferring data between the first memory 12 and the second memory 14. The EDT multiplexer (muxer) 30, as used e.g. for Design-for-Test (DFT) compression, is just an example of a particular design.

Figure 6:
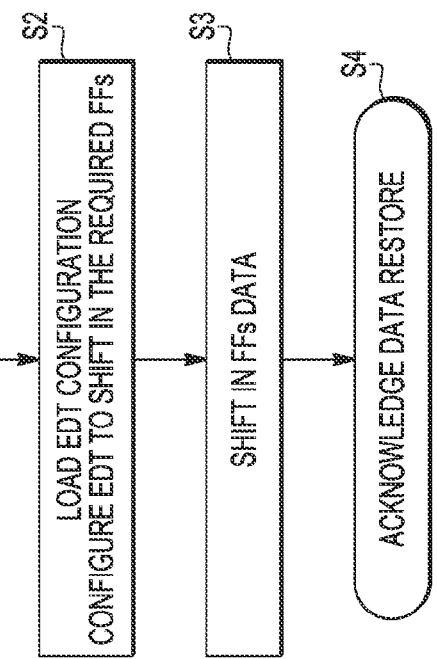
FIG. 6 schematically shows an example of an embodiment of a method of terminating a reduced power mode.
Figure 5:
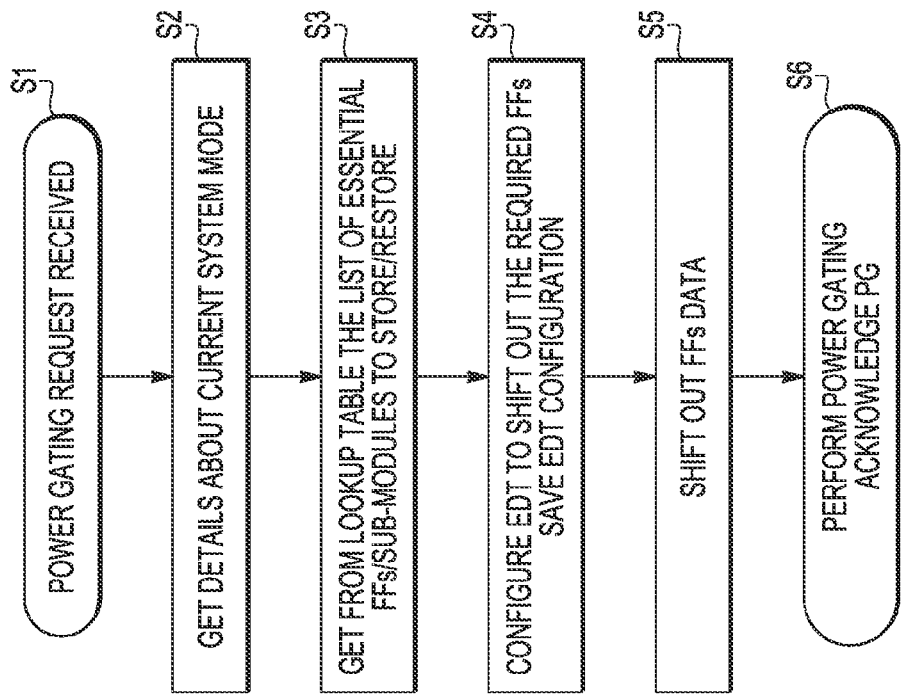
FIG. 5 schematically shows an example of an embodiment of a method of starting a reduced power mode.

FIGS. 5 and 6 relate to a method of operating an information processing device 10. The information processing device comprises a first memory 12, a second memory 14, data transfer circuitry 22, and power gating circuitry 18, as described above with reference to FIG. 1. The first memory comprises at least two memory units 16. A request for setting the information processing device 10 into a reduced power mode is received or generated. In response to the request, specific memory units 24 among the memory units 16 are selected. The data transfer circuitry 22 is controlled to transfer data from the selected memory units 24 to the second memory 14. The power gating circuitry 18 is controlled to power down the selected memory units 24.

Referring specifically to FIG. 5, there is illustrated an example of a method of setting the device 10 into a reduced power mode using power gating. The method is initiated by receiving a Power Gating request. A controller then procures details about the current operating mode of the device (step S2). From a look-up table, the controller obtains a list of memory units, e.g. flip-flops (step S3) and subsequently controls data transfer circuitry to select the flip-flops indicated by the list and to shift out the data from the selected flip-flops to a non-volatile memory (step S5). The selected flip-flops are then powered down using power gating circuitry, and the data transfer is acknowledged (step S6).

Referring to FIG. 6, there is illustrated an example of a method of converting the device 10 from the reduced power mode into a normal power mode. The method is initiated by receiving a Power-Up request (step S1). In subsequent step S2, the data transfer circuitry is configured to transfer the data previously shifted into the non-volatile memory (see FIG. 5) back into the memory units from which the data originated (step S3). Finally (step S4), receipt of the data having being restored is acknowledged.

Figure 7:
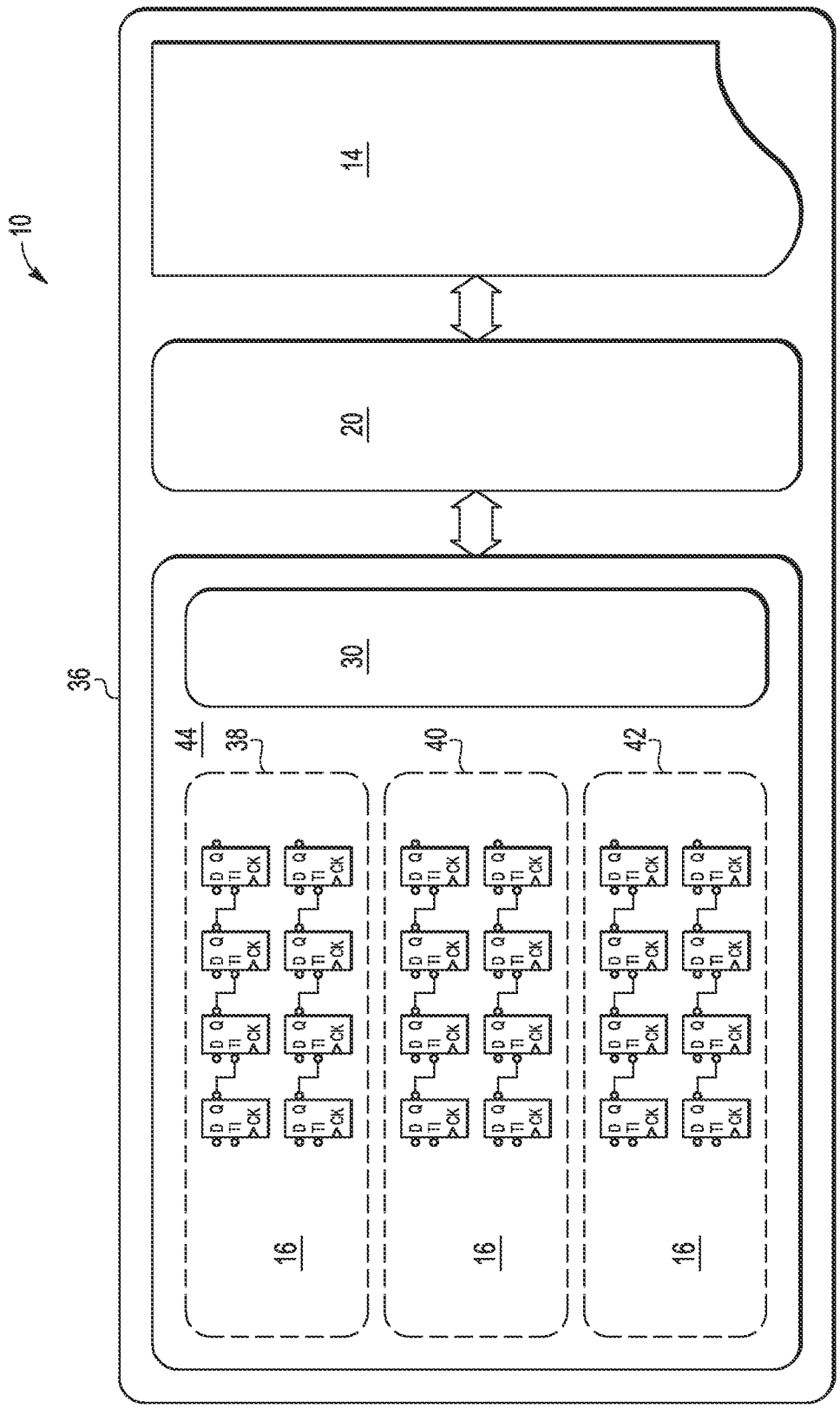
FIG. 7 schematically shows an example of an embodiment of a system on a chip.

Schematically represented in FIG. 7 is an example of an information processing device 10 implemented as a system on a chip 36. The information processing device 10 comprises a Central Processing Unit (CPU) 44, a multiplexer 30, a controller 20, and a second memory 14 as described above. The CPU 44 comprises memory units 16. The memory units 16 are a stack 38, a configuration memory 40, and an Arithmetic Logic Unit (ALU) 42, respectively. The multiplexer 30 is connected to the second memory 14 via the controller 20. In response to a request for entering a first reduced power mode (IDLE mode), the controller 20 selects the stack 38 and the configuration memory 40, but not the ALU 42. The state of the stack 38 and the state of the configuration memory 40 are subsequently transferred to the second memory 14. The stack 38 and the configuration memory 40 are subsequently powered off, while the ALU 42 is kept on power.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the power gates 18 in FIG. 1 may be integrated in the controller 20, and the second memory 14 in FIG. 7 may be located off the chip 36.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An information processing device, comprising:
   a first memory comprising at least two volatile memory units;
   a second memory;
   data transfer circuitry coupled to the first memory and to the second memory;
   power gating circuitry coupled to the first memory; and
   a controller programmed to:
   receive or generate a request for setting the information processing device into a reduced power mode;
   in response to the request, select specific memory units among the memory units on the basis of a desired state of the information processing device to be assumed on exiting the reduced power mode;
   control the data transfer circuitry to transfer data from the selected memory units to the second memory; and
   control the power gating circuitry to power down only the selected memory units.

2. The information processing device as set forth in claim 1, wherein the controller is programmed for selecting the specific memory units on the basis of an identifier identifying the reduced power mode.

3. The information processing device as set forth in claim 2, wherein the identifier is indicative of a power saving level.

4. The information processing device as set forth in claim 1, wherein the controller is programmed for selecting the specific memory units on the basis of a current state of the information processing device.

5. The information processing device as set forth in claim 1, wherein the controller is programmed for selecting the specific memory units on the basis of an expected duration of the reduced power mode.

6. The information processing device as set forth in claim 1, wherein the controller is programmed for selecting the specific memory units by means of a look-up table.

7. The information processing device as set forth in claim 1, wherein at least one of the memory units comprises memory elements arranged in a scan chain.

8. The information processing device as set forth in claim 7, wherein the memory elements are latches, flip-flops or registers.

9. The information processing device as set forth in claim 1, wherein the data transfer circuitry comprises a multiplexer.

10. The information processing device as set forth in claim 1, wherein the second memory is a non-volatile memory.

11. The information processing device as set forth in claim 1, comprising a Central Processing Unit comprising the memory units.

12. The information processing device as set forth in claim 1, wherein the controller is software-configured for selecting specific memory units among the memory units.

13. A method of operating an information processing device, the information processing device comprising a first memory, a second memory, data transfer circuitry, and power gating circuitry; the first memory comprising at least two volatile memory units, the method comprising:
   receiving or generating a request for setting the information processing device into a reduced power mode;
   in response to the request, selecting specific memory units among the memory units on the basis of an identifier identifying the reduced power mode;
   controlling the data transfer circuitry to transfer data from the selected memory units to the second memory; and
   controlling the power gating circuitry to power down only the selected memory units.

14. The method of claim 13, further comprising selecting the specific memory units on the basis of a desired state of the information processing device to be assumed on exiting the reduced power mode.

15. An information processing device comprising:
   a first memory including at least two volatile memory units;
   a second memory;
   data transfer circuitry coupled to the first memory and to the second memory;
   power gating circuitry coupled to the first memory; and
   a controller, the controller programmed to:
   receive or generate a request for setting the information processing device into a reduced power mode;
   in response to the request, select specific memory units among the memory units on the basis of an identifier identifying the reduced power mode;
   control the data transfer circuitry to transfer data from the selected memory units to the second memory; and
   control the power gating circuitry to power down only the selected memory units.

16. The information processing device as set forth in claim 15, wherein the identifier is indicative of a power saving level.

17. The information processing device as set forth in claim 15, wherein the controller is programmed to select the specific memory units on the basis of a current state of the information processing device.

18. The information processing device as set forth in claim 15, wherein the controller is programmed to select the specific memory units on the basis of a desired state of the information processing device to be assumed on exiting the reduced power mode.

19. The information processing device as set forth in claim 15, wherein the controller is programmed to select the specific memory units on the basis of an expected duration of the reduced power mode.

* * * * *